United States Patent
Arai et al.

(10) Patent No.: US 9,049,795 B2
(45) Date of Patent: Jun. 2, 2015

(54) ROLLED COPPER OR COPPER-ALLOY FOIL PROVIDED WITH ROUGHENED SURFACE

(75) Inventors: Hideta Arai, Ibaraki (JP); Atsushi Miki, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 0 days.

(21) Appl. No.: 14/004,794

(22) PCT Filed: Feb. 10, 2012

(86) PCT No.: PCT/JP2012/053106
§ 371 (c)(1),
(2), (4) Date: Oct. 17, 2013

(87) PCT Pub. No.: WO2012/132576
PCT Pub. Date: Oct. 4, 2012

(65) Prior Publication Data
US 2014/0037976 A1 Feb. 6, 2014

(30) Foreign Application Priority Data
Mar. 25, 2011 (JP) .................................. 2011-067748

(51) Int. Cl.
| | |
|---|---|
| B32B 15/20 | (2006.01) |
| H05K 1/09 | (2006.01) |
| C25D 5/10 | (2006.01) |
| C25D 7/06 | (2006.01) |
| H05K 3/38 | (2006.01) |
| C25D 3/38 | (2006.01) |

(52) U.S. Cl.
CPC ........... *H05K 1/09* (2013.01); *Y10T 428/12076* (2015.01); *C25D 5/10* (2013.01); *C25D 7/0614* (2013.01); *H05K 3/384* (2013.01); *H05K 2201/0355* (2013.01); *C25D 3/38* (2013.01)

(58) Field of Classification Search
CPC .......................... H05K 1/09; Y10T 428/12076
USPC .................. 428/615, 618, 668, 675, 609, 671
See application file for complete search history.

(56) References Cited

U.S. PATENT DOCUMENTS

| | | | | |
|---|---|---|---|---|
| 4,159,231 | A | * 6/1979 | Smith et al. | ................... 205/107 |
| 4,935,310 | A | 6/1990 | Nakatsugawa | |
| 5,019,222 | A | * 5/1991 | Hino et al. | ................... 205/152 |
| 5,458,746 | A | * 10/1995 | Burgess et al. | ................. 205/77 |
| 6,638,642 | B2 | 10/2003 | Kitano et al. | |
| 6,835,241 | B2 | 12/2004 | Tsuchida et al. | |

(Continued)

FOREIGN PATENT DOCUMENTS

| | | |
|---|---|---|
| JP | 02-292894 A | 12/1990 |
| JP | 02-292895 A | 12/1990 |

(Continued)

*Primary Examiner* — Cathy Lam
(74) *Attorney, Agent, or Firm* — Howson & Howson LLP

(57) ABSTRACT

Provided is a rolled copper or copper-alloy foil having a roughened surface, the rolled copper or copper-alloy foil subjected to roughening treatment with copper fine grains wherein a copper base plating layer is provided between the copper roughened layer and the rolled copper or copper-alloy foil. An object of the present invention is to provide a roughened rolled copper-alloy foil having fewer craters, the presence of which is a serious disadvantage unique to a rolled copper-alloy foil having a roughened surface. In particular, provided is a rolled copper or copper-alloy foil in which the development of craters caused by inclusions present in or near a surface of the base material can be controlled.

17 Claims, 2 Drawing Sheets

(a) Conventional treatment    (b) Treatment of the present invention

(56) References Cited

U.S. PATENT DOCUMENTS

| | | |
|---|---|---|
| 6,835,442 B2 | 12/2004 | Kudo et al. |
| 8,142,905 B2 | 3/2012 | Moriyama et al. |
| 2002/0182432 A1 | 12/2002 | Sakamoto et al. |
| 2004/0209109 A1 | 10/2004 | Tsuchida et al. |
| 2009/0162685 A1 | 6/2009 | Kobayashi et al. |
| 2010/0212941 A1 | 8/2010 | Higuchi |
| 2011/0262764 A1 | 10/2011 | Arai et al. |
| 2012/0107637 A1 | 5/2012 | Akase |
| 2012/0135266 A1 | 5/2012 | Kaminaga |
| 2012/0276412 A1 | 11/2012 | Miki |
| 2013/0011690 A1 | 1/2013 | Arai et al. |
| 2013/0011734 A1 | 1/2013 | Arai et al. |
| 2013/0189538 A1 | 7/2013 | Moriyama |
| 2013/0220685 A1 | 8/2013 | Kohiki et al. |

FOREIGN PATENT DOCUMENTS

| | | |
|---|---|---|
| JP | H09-87889 A | 3/1997 |
| JP | 2002-241989 A | 8/2002 |
| JP | 2005-290521 A | 10/2005 |
| JP | 2009-164488 A | 7/2009 |
| JP | 2010-037585 A | 2/2010 |
| WO | 2011/138876 A1 | 11/2011 |

\* cited by examiner

[The cause of craters]
The presence of inclusions such as cupric oxide on a surface layer of a copper foil inhibits the formation of roughening grains.

(a) Conventional treatment     (b) Treatment of the present invention

ROLLED COPPER OR COPPER-ALLOY FOIL PROVIDED WITH ROUGHENED SURFACE

BACKGROUND

The present invention relates to a rolled copper or copper-alloy foil provided with a roughened surface. In particular, the present invention relates to a rolled copper or copper-alloy foil having fewer craters (which are failures in the roughening treatment caused by inclusions present at a surface layer of the copper foil), having good adhesive strength with a resin layer, having acid resistance and tin plating solution resistance, having high peel strength, having good etchability and glossiness, and suitable for manufacturing a flexible printed circuit board in which wiring can be finely patterned.

In recent years, due to advances in micro integration technologies for on-board components such as semiconductor devices and various electronic chip components, finer patterned wiring is increasingly demanded for printed wiring boards prepared from flexible printed circuit boards to mount those components.

Conventionally, an electrolytic copper foil subjected to roughening treatment to improve adhesiveness with resin has been used. However, this roughening treatment significantly impairs the etchability of the copper foil, leading to difficulty in etching at a high aspect ratio, and resulting in the occurrence of undercutting upon etching. These have posed a problem that sufficient fine pattern formation can not be achieved.

Accordingly, in order to control the occurrence of undercutting upon etching and satisfy the demand of fine pattern formation, lightly performing the roughening treatment of an electrolytic copper foil, that is, low profiling (reduced roughness) has been proposed.

However, low profiling treatment of an electrolytic copper foil has a problem that the adhesion strength between the electrolytic copper foil and an insulating polyimide layer is reduced. However, for this reason, desired adhesive strength can not be maintained, causing a problem that wiring falls off from the polyimide layer during processing while a high level of fine pattern formation has been demanded.

To solve the above problem, proposed is a method comprising: forming a thin zinc-based metal layer on an electrolytic copper foil having a non-roughened surface; and further forming a polyimide-based resin layer thereon (for example, see Patent Document 1).

Further, proposed is a technology in which a phosphorus-containing nickel plating layer is formed on an electrolytic copper foil in order to prevent undercutting (for example, see Patent Document 2). However, in this case, the surface of the electrolytic copper foil is required to be roughened or at least can be roughened. Furthermore, all of Examples in Patent Document 2 involve the formation of a phosphorus-containing nickel plating layer on a roughened surface of an electrolytic copper foil.

Nonetheless, with regard to properties required for a high level of fine pattern formation on a copper foil, problems are not limited to undercutting upon etching and adhesiveness with resin as described above. For example, strength, acid resistance, tin plating solution resistance, glossiness and the like are required to be excellent.

However, in the conventional technologies, these overall problems are not addressed, and currently, an appropriate copper foil capable of solving these problems is not found.

In this context, a pure copper-based rolled copper foil having high strength has been used in order to solve the problems in an electrolytic copper foil as described above.

In general, known is a copper foil in which a common pure copper-based rolled copper foil is further subjected to fine copper plating (so-called "copper nodule treatment of red color") to improve the adhesion strength with resin or the like.

Usually, alloy plating of copper and cobalt or ternary alloy plating of copper, cobalt and nickel is further formed on this roughened surface to give a copper foil for printed circuits (see Patent Document 3 and Patent Document 4).

Recently, alternative to these conventional rolled copper foils, proposed is a rolled copper-alloy foil having further improved strength and corrosion resistance by which wiring can be finely patterned.

However, in a case where such a copper alloy rolled copper foil is plated with copper to form fine copper grains, a fault called a crater has occurred. This crater refers to a region of treatment failure (a spot), in other words, a non-treated fault in which copper grains are not formed or sparsely formed.

Note that the crater has an area of about 10 to 50 $\mu m^2$ and an average diameter of about 3 to 10 $\mu m$. The term "crater(s)" as used herein is used in this meaning.

Accordingly, by improving plating treatment, the present applicants have proposed a rolled copper-alloy foil having 10 craters per 25 $mm^2$ on a roughened surface of the rolled copper-alloy foil that was subjected to roughening treatment with copper fine grains (see Patent Document 5 shown below). In the above technology, which has been a very effective, the development of craters has been still observed albeit a small amount.

Patent Document 1: Japanese Patent Laid-Open No. 2002-217507

Patent Document 2: Japanese Patent Laid-Open No. S56-155592

Patent Document 3: Japanese Patent Publication No. H6-50794

Patent Document 4: Japanese Patent Publication No. H6-50795

Patent Document 5: Japanese Patent Laid-Open No. 2005-290521

SUMMARY OF INVENTION

Technical Problem

The present invention is made in view of the above problems. An object of the present invention is to provide a rolled copper or copper-alloy foil with a roughened surface having fewer craters, the presence of which is a serious disadvantage unique to a rolled copper-alloy foil having a roughened surface, and in particular, to provide a rolled copper or copper-alloy foil in which the development of craters caused by inclusions present in or near a surface layer of the base material can be reduced. Thereby, provided is a rolled copper or copper-alloy foil having high strength, good adhesive strength with a resin layer, acid resistance and tin plating solution resistance, and further having high peel strength, good etchability and glossiness, and suitable for a flexible printed circuit board in which wiring can be finely patterned.

Solution to Problem

Accordingly, the present invention provides: 1) a rolled copper or copper-alloy foil provided with a roughened surface, the rolled copper or copper-alloy foil subjected to roughening treatment with copper fine grains wherein a copper base plating layer is provided between the copper roughened layer and the rolled copper or copper-alloy foil; 2) the rolled copper or copper-alloy foil provided with a roughened surface according to 1), wherein the copper base plating layer has a thickness of between 0.15 μm and 0.30 μm inclusive; and 3) the rolled copper or copper-alloy foil according to 1) or 2), wherein copper fine grains of the copper roughened layer obtained by roughening treatment with the copper fine gains have a size between 0.25 μm and 0.45 μm inclusive.

Further, the present invention provides: 4) the rolled copper or copper-alloy foil according to any one of 1) to 3), wherein a roughened layer comprising Co—Ni—Cu fine grains of between 0.05 μm and 0.25 μm inclusive is provided on the copper roughened layer obtained by roughening treatment with the fine copper grains; and 5) the rolled copper or copper-alloy foil according to 4), wherein the Co—Ni—Cu grains has a composition of Cu: 10 to 30 mg/dm$^2$, Ni: 50 to 500 μg/dm$^2$, and Co: 100 to 3,000 μg/dm$^2$.

Advantageous Effects of Invention

The present invention enables to provide a roughened rolled copper-alloy foil having fewer craters (which are failures in the roughening treatment caused by inclusions present at a surface layer of the copper foil), the craters being a serious disadvantage unique to a rolled copper-alloy foil having a roughened surface. In particular, advantageously, the present invention can inhibit the development of craters caused by inclusions present in or near a surface layer of the base material. As a result, advantageously, the roughened rolled copper or copper-alloy foil has high strength, good adhesive strength with a resin layer, acid resistance, tin plating solution resistance, and high peel strength; shows good etchability and glossiness; and is suitable for manufacturing a flexible printed circuit board and the like in which wiring can be finely patterned.

DETAILED DESCRIPTION OF EMBODIMENTS

Investigating what causes the development of craters revealed that a base material (a rolled copper foil or copper-alloy foil) is responsible for craters, and that the presence of inclusions present in or near the surface of the base material increases the frequency of the development of craters. The term "inclusions" used in the present invention refers to compound grains present in the matrix of a base material (a rolled copper foil or copper-alloy foil).

Specifically, they include oxides, sulfides, compounds between added elements, and the like. For example, in the case of a rolled copper foil comprising tough pitch copper, they are cupric oxide grains. In oxygen-free copper, there are very few cupric oxide grains, but there are considerable amount of oxides and sulfides from impurities.

Further, in the case of a rolled copper-alloy foil, when added elements comprise elements susceptible to oxidation, for example Zr, inclusions are these oxides. Further, an example of sulfides is copper sulfide.

Figure 1:
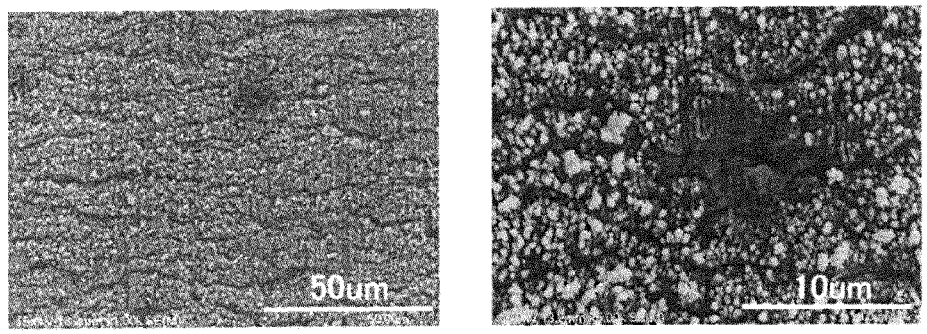
FIG. 1 This shows SEM images of the region where a crater is developed and the cause thereof.
Figure 1:
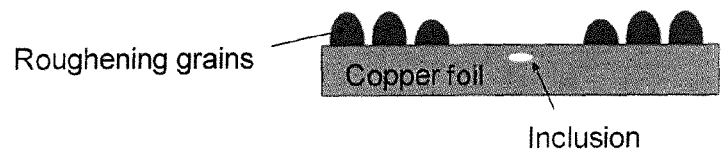

In addition, craters are often developed upon copper-based roughening treatment. FIG. 1 shows SEM images of the region where a crater is developed and the cause thereof.

As shown in FIG. 1, the presence of inclusions such as cupric oxide in the surface of a copper foil inhibits the formation of roughening grains, resulting in the development of a crater (a region of treatment failure or "a spot") at that region.

The present invention can solve a fault resulting from a copper foil or a copper-alloy foil by providing base plating. Base plating is preferably 0.15 μm or more, more preferably 0.2 μm or more. However, when base plating is thick, bending workability is decreased. Therefore too thick plating is not preferred, and specifically 0.3 μm or less is preferred.

For the condition suitable for base plating, a current density of 15.0 A/dm$^2$ or more (41 As/dm$^2$ or more in the amount of coulomb) is preferred. This is shown in FIG. 2.

Figure 2:
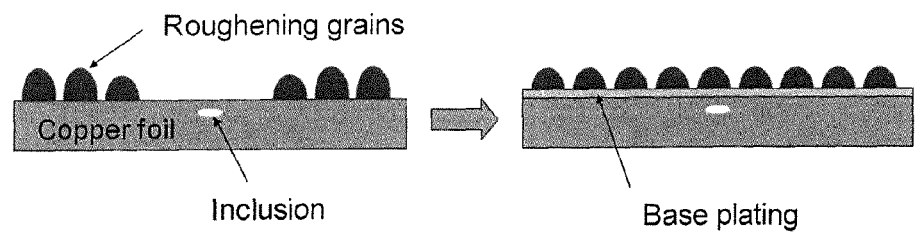
FIG. 2 This shows a method of reducing craters.

As shown in FIG. 2, since base plating is to cover inclusions such as cupric oxide in the surface of a copper foil, subsequent roughening treatment will be performed smoothly and the development of craters is inhibited.

After the roughening treatment, a heat resistant layer of Co—Ni may be provided, and/or a chromate layer may be provided as a rustproofing layer. A typical deposit amount of a heat resistant layer is Co: 200 to 3,000 μg/dm$^2$, and Ni: 100 to 2,000 μg/dm$^2$ for a Co—Ni layer.

The rolled copper or copper-alloy foil, which was subjected to roughening treatment with copper fine grains, of the present invention is a rolled copper or copper-alloy foil in which a copper base plating layer is formed between the copper roughened layer and the rolled copper or rolled copper-alloy foil. The copper base plating layer preferably has a thickness of between 0.15 μm and 0.30 μm inclusive.

By forming the copper base plating layer as described above, the development of craters can be prevented for a roughened copper foil having copper fine grains of between 0.25 μm and 0.45 μm inclusive.

Further, in the roughened layer of a rolled copper or copper-alloy foil, a fine-grain layer of Cu—Co—Ni grains of between 0.05 μm and 0.25 μm inclusive is provided, as a roughened layer, on the copper roughened layer obtained by roughening treatment with copper fine grains. In this case, the Cu—Co—Ni grains have a composition of Cu: 10 to 30 mg/dm$^2$, Co: 100 to 3,000 μg/dm$^2$, and Ni: 50 to 500 μg/dm$^2$. The structure of this roughened layer will be a two-layered structure of: a copper roughened layer obtained by roughening treatment with copper fine grains; and a fine-grain layer of Co—Ni—Cu grains.

The development of craters can also be prevented in the case of the rolled copper or copper-alloy foil having this roughened layer.

In general, the copper roughening grain layer on a rolled copper foil is formed by performing roughening plating under the conditions of copper sulfate (Cu equivalence: 3 to 50 g/L), sulfuric acid: 1 to 150 g/L, temperature: 20 to 40° C., and Dk: 30 to 70 A/dm$^2$.

Figure 3:
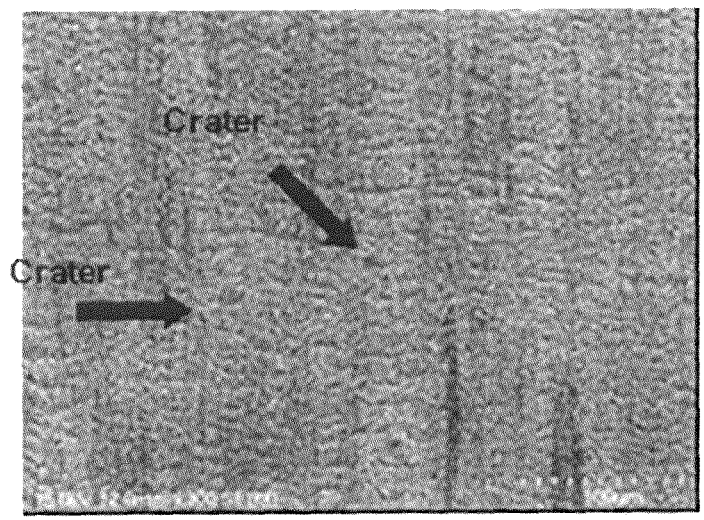
FIG. 3 This shows a SEM image of a surface on which copper roughening treatment was performed without base plating on the rolled copper foil.

However, even in the case of a pure copper-based rolled copper foil, or in particular, in a case where a rolled copper-alloy foil is used, crater-like defects (referred to as "craters" herein) were developed. These craters (defects) in the roughened rolled copper or copper-alloy foil can be observed even under a light microscope. The craters (defective spots) are more clearly observed in a SEM image in FIG. 3 (defective spots are seen at the tips of the arrows in FIG. 3). As shown in FIG. 3, the number of craters tends to increase as the current density increases.

These craters are regions of treatment failure (spots) as described above. Copper grains are not formed or sparsely formed in the regions of the craters. The mechanism of the development of craters has not been necessarily elucidated technically.

Nonetheless, the development of craters appears to be caused by impurities contained in a copper or copper alloy, or the difference in the concentration or segregation of the components in a copper-alloy foil since it is a phenomenon unique to a rolled copper or rolled alloy foil. About 15 to 70 of such craters will be developed per 25 mm$^2$. These craters form clear shadows or black spots in a gold plating layer and the like to be provided later, significantly spoiling the appearance.

In the present invention, a copper base plating layer is formed between the copper roughened layer and the rolled copper or rolled copper-alloy foil. The conditions for the base plating are as follows: copper sulfate (Cu equivalence: 15 to 25 g/L), sulfuric acid: 80 to 120 g/L, temperature: 40 to 60° C., and Dk: 15 to 20 A/dm$^2$.

Further, roughening of the rolled copper or copper-alloy foil of the present invention is performed by roughening plating under the following conditions: copper sulfate (Cu equivalence: 3 to 50 g/L), nickel sulfate (Ni equivalence: 1 to 50 g/L, preferably 1 to 3 g/L), phosphoric acid (P equivalence: 0.75 to 1000 g/L, preferably 0.75 to 1 g/L), sulfuric acid: 1 to 150 g/L, temperature: 20 to 40° C., and Dk: 30 to 70 A/dm$^2$. Copper fine grains are usually formed in the range of 0.1 to 2.0 μm.

By this, the number of craters present in the roughened surface of a rolled copper-alloy foil subjected to roughening treatment with copper fine grains can be controlled to be 0.5/mm$^2$ or less.

As shown in Examples below, peel strength as received, surface roughness and glossiness are all good; and high strength which is unique to a rolled copper foil is maintained; and further, excellent characteristics of acid resistance, tin plating solution resistance and adhesive strength with resin, similar to those of a roughened rolled copper foil having a conventional copper grain layer, are achieved.

For a pure copper-based rolled copper foil, oxygen-free copper and tough pitch copper (oxygen content: 0.02 to 0.05%) can be used. Further, there is no particular limitation for copper-alloy foils. The present invention can be applied in any copper-alloy foils as long as they develop craters caused by the difference in the concentration or segregation of components in the copper-alloy foils. In particular, it is preferable to apply the present invention in: a copper alloy comprising 0.05 to 1 wt % of Cr, 0.05 to 1 wt % of Zr, 0.05 to 1 wt % of Zn, and the reminder being Cu and unavoidable impurities; or a copper-alloy foil comprising 1 to 5 wt % of Ni, 0.1 to 3 wt % of Si, 0.05 to 3 wt % of Mg, and the remainder being Cu and unavoidable impurities. The reason for this is that, in particular, craters can be prevented in the above alloy foils.

A rolled copper foil manufactured is to be continuously wound around a coil. The copper foil obtained as described above can be used for a printed wiring board and the like after further performing electrochemical or chemical or resin or other surface treatment or coating treatment.

The thickness of a copper foil used for high density wiring needs to be 18 μm or less, more preferably 3 to 12 μm. For the roughened rolled copper or copper-alloy foil of the present invention, the thickness is not limited to the above range, and ultra thin foils or thick copper foils can also be used. Further, as other surface treatment, rustproofing treatment with chromium-based metal, zinc-based metal or organic system can be performed if desired. Coupling treatment with silane and the like can also be performed. These are appropriately selected depending on the application of the copper foil for a printed circuit board, and the present invention encompasses all of these.

For the rolled copper or copper-alloy foil, a rolled copper foil without roughening treatment having a surface roughness of 2.5 μm or less will be used.

Specific examples of the copper roughening plating solution of the present invention containing nickel metal or phosphorus to be formed in these rolled copper or copper-alloy foils are shown in the followings.

(Copper-Nickel-Phosphorus Alloy Plating Treatment)
Concentration of Cu ions: 3 to 50 g/L
Concentration of Ni ions: 1 to 50 g/L
Concentration of P ions: 0.75 to 1000 g/L
Sulfuric acid: 1 to 150 g/L
Temperature of electrolytic solution: 20 to 40° C.
pH: 2.0 to 4.0
Current density: 30 to 70 A/dm$^2$
Thickness in electrodeposition equivalence: 0.3 to 25 nm

EXAMPLES

In the followings, the present invention is described based on Examples. Note that Examples herein are merely intended to show preferred examples, and the present invention shall not be construed as limited to these Examples. Therefore, the present invention encompasses all of modifications and other embodiments or aspects within the sprit of the present invention. Note that Comparative Example is shown for comparison with the present invention.

Example 1

A rolled copper alloy foil comprising Cr: 0.2 wt %, Zr: 0.1 wt %, Zn: 0.2 wt %, and the remainder being Cu and unavoidable impurities was used as a copper foil.

This rolled copper foil was degreased and then washed with water, and subsequently washed with acid and then water, and then a copper base plating layer having a thickness of 0.04 μm was formed under the following conditions: copper sulfate (Cu equivalence: 20 g/L), sulfuric acid: 100 g/L, temperature: 50° C., and Dk: 5.0 A/dm$^2$ (C: 10.3 As/dm$^2$). The thickness of a base plating layer is a theoretical value from the amount of coulomb and the specific gravity of copper.

Next, roughening treatment via copper plating with 0.4 μm copper grains was further performed on the base plating layer under the condition of Dk: 50 A/dm$^2$ (C: 70 As/dm$^2$).

For this rolled copper-alloy foil subjected to the roughening plating, various evaluation tests were conducted under the conditions set forth in the followings. Note that Comparative Example is shown for comparison with the present invention. In this Comparative Example, copper roughening treatment without additives was performed. The results are shown in Table 1.

Figure 4:
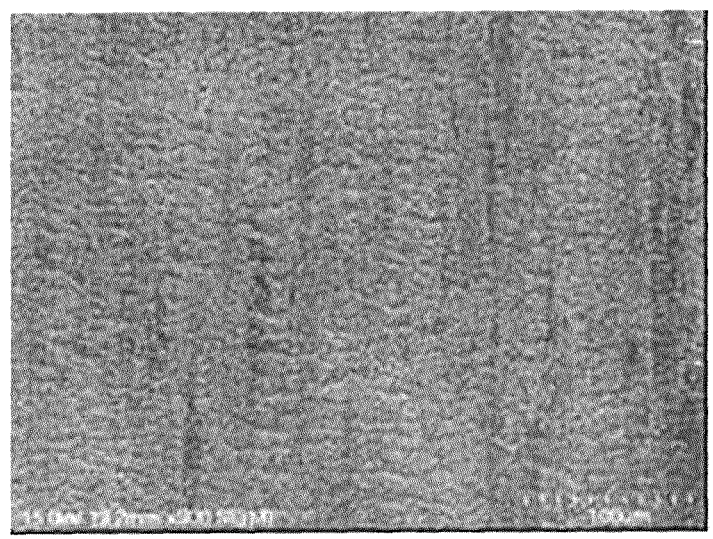
FIG. 4 This shows a SEM image of a surface on which copper roughening treatment was performed after base plating on the rolled copper foil.

FIG. 4 shows a SEM image of a surface on which copper roughening was performed after base plating on the rolled copper foil of this Example. As shown in the figure, craters were not observed on many regions of the surface.

(Investigation of the Number of Craters)

With regard to the number of craters, the number of craters on the copper roughened surface was counted under a light microscope with the thickness of the base plating changed variously.

As clearly shown in Table 1, this Example showed fewer craters, and the number was 4.2 per 25 mm$^2$.

TABLE 1

|  | Conditions for base plating | | | Conditions for forming roughening grains | | Number of craters per 25 mm² |
| --- | --- | --- | --- | --- | --- | --- |
|  | Dk A/dm² | C As/dm² | Plating thickness (μm) | Dk A/dm² | C As/dm² | |
| Comparative Example | 0.0 | 0.0 | 0.00 | 50 | 70 | 10.0 |
| Example 1 | 5.0 | 10.3 | 0.04 | 50 | 70 | 4.2 |
| Example 2 | 10.0 | 20.7 | 0.08 | 50 | 70 | 2.1 |
| Example 3 | 15.0 | 41.0 | 0.15 | 50 | 70 | 0.5 |
| Example 4 | 17.5 | 67.2 | 0.25 | 50 | 70 | 0.0 |
| Example 5 | 20.0 | 72.4 | 0.27 | 50 | 70 | 0.0 |

Example 2

A copper base plating layer with a thickness of 0.08 μm was formed under the condition for forming a copper base plating layer of Dk: 10.0 A/dm² (C: 20.7 As/dm²). Other conditions are the same as in Example 1. The number of craters on the copper roughened surface was counted under a light microscope to investigate the number. The results are also shown in Table 1. As shown in Table 1, Example 2 showed fewer craters, and the number was 2.1 per 25 mm².

Example 3

A copper base plating layer with a thickness of 0.15 μm was formed under the condition for forming a copper base plating layer of Dk: 15.0 A/dm² (C: 41.0 As/dm²). Other conditions are the same as in Example 1. The number of craters on the copper roughened surface was counted under a light microscope to investigate the number. The results are also shown in Table 1. As shown in Table 1, Example 3 showed fewer craters, and the number was 0.5 per 25 mm².

Example 4

A copper base plating layer with a thickness of 0.25 μm was formed under the condition for forming a copper base plating layer of Dk: 17.5 A/dm² (C: 67.2 As/dm²). Other conditions are the same as in Example 1. The number of craters on the copper roughened surface was counted under a light microscope to investigate the number. The results are also shown in Table 1. As shown in Table 1, Example 4 showed fewer craters, and the number was 0.0 per 25 mm².

Example 5

A copper base plating layer with a thickness of 0.27 μm was formed under the condition for forming a copper base plating layer of Dk: 20.0 A/dm² (C: 72.4 As/dm²). Other conditions are the same as in Example 1. The number of craters on the copper roughened surface was counted under a light microscope to investigate the number. The results are also shown in Table 1. As shown in Table 1, Example 5 showed fewer craters, and the number was 0.0 per 25 mm².

Comparative Example 1

In this Comparative Example 1, base plating was not performed, but other conditions were the same as in Example 1. The results show that the number of craters was 10.0 per 25 mm², which was a very large number. The results are also shown in Table 1.

The present invention can provide a roughened rolled copper-alloy foil having fewer craters, the presence of which is a serious disadvantage unique to a rolled copper-alloy foil having a roughened surface. In particular, advantageously, the present invention can control the development of craters caused by inclusions present in or near a surface layer of the base material. Further, achieved are high strength, good adhesive strength with a resin layer, acid resistance and tin plating solution resistance as well as high peel strength and good etchability and glossiness. Accordingly, the present invention is extremely effective for manufacturing a flexible printed circuit board and the like in which wiring can be finely patterned on the roughened rolled copper-alloy foil of the present invention.

The invention claimed is:

1. A rolled copper or copper-alloy foil provided with a roughened surface, the rolled copper or copper-alloy foil subjected to roughening treatment with copper fine grains wherein a copper base plating layer is provided between the copper roughened layer and the rolled copper or rolled copper-alloy foil, the copper base plating layer having a thickness of 0.15 to 0.30 μm.

2. The rolled copper or copper-alloy foil according to claim 1, wherein the copper fine grains of the copper roughened layer are of a size between 0.25 μm and 0.45 μm inclusive.

3. The rolled copper or copper-alloy foil according to claim 1, wherein a roughened layer comprising Co—Ni—Cu fine grains of between 0.05 μm and 0.25 μm inclusive is provided on the copper roughened layer obtained by roughening treatment with the copper fine grains.

4. The rolled copper or copper-alloy foil according to claim 3, wherein the Co—Ni—Cu grains have a composition of Cu: 10 to 30 mg/dm², Ni: 50 to 500 μg/dm², and Co: 100 to 3,000 μg/dm².

5. The rolled copper or copper-alloy foil according to claim 1, wherein the roughened surface has 4.2 craters or less per 25 mm².

6. The rolled copper or copper-alloy foil according to claim 1, wherein the roughened surface has 0.5 craters or less per 25 mm².

7. A rolled copper or copper-alloy foil provided with a roughened surface, the rolled copper or copper-alloy foil subjected to roughening treatment with copper fine grains wherein a copper base plating layer is provided between a first copper roughened layer of the copper fine grains and the rolled copper or rolled copper-alloy foil, and wherein a second roughened layer comprising Co—Ni—Cu fine grains of a size of 0.05 to 0.25 μm is further provided on the first copper roughened layer of the copper fine grains.

8. The rolled copper or copper-alloy foil according to claim 7, wherein the second roughened layer of the Co—Ni—Cu fine grains has a composition of Cu: 10 to 30 mg/dm$^2$, Ni: 50 to 500 μg/dm$^2$, and Co: 100 to 3,000 μg/dm$^2$.

9. The rolled copper or copper-alloy foil according to claim 8, wherein the copper base plating layer has a thickness of 0.15 to 0.30 μm.

10. The rolled copper or copper-alloy foil according to claim 9, wherein the copper fine grains of the first copper roughened layer are of a size of 0.25 to 0.45 μm.

11. The rolled copper or copper-alloy foil according to claim 10, wherein the roughened surface has 4.2 craters or less per 25 mm$^2$.

12. The rolled copper or copper-alloy foil according to claim 10, wherein the roughened surface has 0.5 craters or less per 25 mm$^2$.

13. A rolled copper or copper-alloy foil provided with a roughened surface, the rolled copper or copper-alloy foil subjected to roughening treatment with copper fine grains wherein a copper base plating layer is provided between a copper roughened layer of the copper fine grains and the rolled copper or rolled copper-alloy foil, and the roughened surface having 4.2 craters or less per 25 mm$^2$.

14. The rolled copper or copper-alloy foil according to claim 13, wherein the roughened surface has 0.5 craters or less per 25 mm$^2$.

15. The rolled copper or copper-alloy foil according to claim 13, further comprising a second roughened layer provided on the copper roughened layer obtained by roughening treatment with the copper fine grains.

16. The rolled copper or copper-alloy foil according to claim 15, wherein the second roughened layer comprises Co—Ni—Cu fine grains of a size of 0.05 to 0.25 and a composition of Cu: 10 to 30 mg/dm$^2$, Ni: 50 to 500 μg/dm$^2$, and Co: 100 to 3,000 μg/dm$^2$.

17. The rolled copper or copper-alloy foil according to claim 16, wherein the roughened surface formed by the first and second roughened layers has 0.5 craters or less per 25 mm$^2$.

\* \* \* \* \*